(12) United States Patent
Wirola et al.

(10) Patent No.: US 9,319,065 B2
(45) Date of Patent: Apr. 19, 2016

(54) ENCODING AND DECODING OF DATA

(75) Inventors: Lauri Aarne Johannes Wirola, Tampere, FL (US); Tommi Antero Laine, Tampere, FL (US); Jari Syrjarinne, Tampere, FL (US)

(73) Assignee: Nokia Technologies Oy, Espoo (FI)

( * ) Notice: Subject to any disclaimer, the term of this patent is extended or adjusted under 35 U.S.C. 154(b) by 36 days.

(21) Appl. No.: 14/384,087

(22) PCT Filed: Mar. 15, 2012

(86) PCT No.: PCT/IB2012/051233
§ 371 (c)(1),
(2), (4) Date: Nov. 17, 2014

(87) PCT Pub. No.: WO2013/136129
PCT Pub. Date: Sep. 19, 2013

(65) Prior Publication Data
US 2015/0311916 A1    Oct. 29, 2015

(51) Int. Cl.
*H03M 7/40* (2006.01)
*H03M 7/46* (2006.01)
*G01S 5/02* (2010.01)

(52) U.S. Cl.
CPC .. *H03M 7/46* (2013.01); *G01S 5/02* (2013.01); *G01S 5/0252* (2013.01)

(58) Field of Classification Search
CPC ........... H03M 7/46; G01S 5/02; G01S 5/0252
USPC ..................................................... 341/67, 65
See application file for complete search history.

(56) References Cited

U.S. PATENT DOCUMENTS

| | | | |
|---|---|---|---|
| 6,711,404 B1 | 3/2004 | Arpee et al. | |
| 6,897,977 B1 * | 5/2005 | Bright | G06T 9/001 358/1.18 |
| 7,499,491 B2 * | 3/2009 | Lee | G06T 7/2026 375/240.12 |
| 7,924,735 B2 | 4/2011 | Sun et al. | |
| 8,036,274 B2 * | 10/2011 | Srinivasan | H04N 19/63 375/240.18 |
| 8,730,236 B2 * | 5/2014 | Fishwick | G06T 17/20 345/419 |
| 2003/0142523 A1 | 7/2003 | Biacs | |

(Continued)

FOREIGN PATENT DOCUMENTS

| | | |
|---|---|---|
| CN | 1570664 A | 1/2005 |
| CN | 101334467 A | 12/2008 |

(Continued)

OTHER PUBLICATIONS

International Search Report and Written Opinion received for corresponding Patent Cooperation Treaty Application No. PCT/IB2012/051233, mailed Sep. 26, 2012, 10 pages.

(Continued)

*Primary Examiner* — Khai M Nguyen
(74) *Attorney, Agent, or Firm* — Nokia Technologies Oy

(57) ABSTRACT

An apparatus run-length encodes data to obtain a sequence of records. The data are associate to grid points of a grid and the records are defined such that they allow embedding data associated to a same grid point and representing pieces of information of at least two different types in a same record. The encoded data may be stored or transmitted. When receiving or retrieving such run-length encoded data in a sequence of records, the data may be run-length decoded to obtain decoded data and an association of the decoded data to the grid points of the grid.

20 Claims, 7 Drawing Sheets

(56) References Cited

U.S. PATENT DOCUMENTS

| | | |
|---|---|---|
| 2007/0049286 A1 | 3/2007 | Kim et al. |
| 2007/0133487 A1 | 6/2007 | Wang et al. |
| 2008/0004037 A1 | 1/2008 | Achlioptas et al. |
| 2008/0132247 A1 | 6/2008 | Anderson |
| 2008/0267300 A1 | 10/2008 | Benndorf |
| 2010/0039929 A1 | 2/2010 | Cho et al. |
| 2010/0114909 A1 | 5/2010 | Museth |
| 2010/0127933 A1 | 5/2010 | Kuo et al. |

FOREIGN PATENT DOCUMENTS

| | | |
|---|---|---|
| CN | 101360322 A | 2/2009 |
| CN | 102204374 A | 9/2011 |
| EP | 1471688 A2 | 10/2004 |
| EP | 1662837 A2 | 5/2006 |
| EP | 1506687 B1 | 6/2006 |
| EP | 2098883 A2 | 9/2009 |
| WO | 0212914 | 2/2002 |
| WO | 2008/036860 A1 | 3/2008 |
| WO | 2010/040404 A1 | 4/2010 |
| WO | 2010/054178 A1 | 5/2010 |
| WO | 2010/077821 A1 | 7/2010 |
| WO | 2011/008807 A2 | 1/2011 |
| WO | 2011/110899 A1 | 9/2011 |
| WO | 2011/135406 A1 | 11/2011 |
| WO | 2011/154769 A1 | 12/2011 |

OTHER PUBLICATIONS

Martinez et al., "Using the Run Length Encoding Features on the MPC5645S", Freescale Semiconductor, Document No. AN4339, Rev. 0, Aug. 2011, 8 pages.

Pastuszek et al., "Highly Accurate Mobile Device Positioning Based on Wi-Fi Signals", Senior projects, Braintrust Report, 2011, 10 pages.

International Search Report and Written Opinion received for corresponding Patent Cooperation Treaty Application No. PCT/IB2012/051227, mailed Jun. 11, 2012, 13 pages.

International Search Report and Written Opinion received for corresponding Patent Cooperation Treaty Application No. PCT/IB2012/051230, mailed Feb. 20, 2013, 12 pages.

Lemelson et al., "Automatic Identification of Fingerprint Regions for Quick and Reliable Location Estimation", 8th IEEE International Conference on Pervasive Computing and Communications Workshops, Mar. 29-Apr. 2, 2010, pp. 540-545.

Leppakoski et al., "Optimizing Radio Map for WLAN fingerprinting", Ubiquitous Positioning Indoor Navigation and Location Based Service, Oct. 14-15, 2010, 8 pages.

Lemelson et al., "Improvements for 802.11-Based Location Fingerprinting Systems", 33rd Annual IEEE International Computer Software and Applications Conference, vol. 1, Jul. 20-24, 2009, pp. 21-28.

Office action received for corresponding Chinese Patent Application No. 201280073196.6, dated Nov. 4, 2015, 9 pages of office action and no page of office action translation available.

\* cited by examiner

ENCODING AND DECODING OF DATA

RELATED APPLICATION

This application was originally filed as PCT Application No. PCT/IB2012/051233 filed Mar. 15, 2012.

FIELD OF THE DISCLOSURE

The invention relates to the field of encoding and decoding of data, and more specifically to encoding and decoding data that is associated to grid points of a grid.

BACKGROUND

Some kind of data may have values that are related to various locations in an area. The locations may be geographical locations or other types of locations, for instance positions in an image. In order to facilitate a processing of the data, the data may be associated to one or more grid points of a grid, the grid points representing a limited number of locations with a suitable spacing to each other.

For example, modern global cellular and non-cellular positioning technologies are based on collecting large global databases containing information on cellular and non-cellular signals. This data may originate entirely or partially from users of these positioning technologies.

The data provided by users is typically in the form of "fingerprints", which contain a location that is estimated based on, e.g., received satellite signals of a global navigation satellite system (GNSS) and the measurements taken from one or more radio interfaces for signals of a cellular and/or non-cellular terrestrial system. For measurements on cellular signals, the measurements may contain a global and/or local identification (ID) of the cellular network cells observed, their signal strengths and/or pahtlosses, and timing measurements like timing advance (TA) or round-trip time. For measurements on wireless local area network (WLAN) signals, as an example of signals of a non-cellular system, the measurements may contain a basic service set identification (BSSID), like the medium access control (MAC) address of observed access points, the service set identifier (SSID) of the access points, and the signal strength of received signals (received signal strength indication RSSI or physical Rx level in dBm with a reference value of 1 mW, etc.).

This data may then be transferred to a server or cloud, where various radio models may be generated for positioning purposes. In this process, the measurements may be associated to grid points of a grid that represent locations close to the respective measuring position. In the end, these refined radio models may be transferred back to user terminals for use in position determination.

SUMMARY OF SOME EMBODIMENTS OF THE INVENTION

For a first aspect of the invention, a method is described, which comprises at an apparatus run-length encoding data, which are associate to grid points of a grid, to obtain a sequence of records, the records being defined such that they allow embedding data associated to a same grid point and representing pieces of information of at least two different types in a same record. The method further comprises causing at least one of storage and transmission of the encoded data.

For a second aspect of the invention, a method is described, which comprises at an apparatus receiving or retrieving run-length encoded data in a sequence of records, wherein the data are associate to grid points of a grid and wherein data, which are associated to a same grid point of the grid and which represent pieces of information of at least two different types, are embedded in a same record of the sequence of records. The method further comprises run-length decoding the data to obtain decoded data and an association of the decoded data to the grid points of the grid.

Each of the aspects thus makes use of records in which data associated to a same grid point of a grid and representing pieces of information of at least two different types may be embedded in a single record in a run-length encoding.

For each of the aspects of the invention, moreover a first apparatus is described, which comprises means for realizing the actions of the method presented for the first and/or second aspect of the invention.

The means of these apparatuses can be implemented in hardware and/or software. They may comprise for instance a processor for executing computer program code for realizing the required functions, a memory storing the program code, or both. Alternatively, they could comprise for instance circuitry that is designed to realize the required functions, for instance implemented in a chipset or a chip, like an integrated circuit.

For each of the aspects of the invention, moreover a second apparatus is described, which comprises at least one processor and at least one memory including computer program code, the at least one memory and the computer program code configured to, with the at least one processor, cause an apparatus at least to perform the actions of the method presented for the first and/or second aspect of the invention.

For each of the aspects of the invention, moreover a non-transitory computer readable storage medium is described, in which computer program code is stored. The computer program code causes an apparatus to realize the actions of the method presented for the first and/or second aspect of the invention when executed by a processor.

The computer readable storage medium could be for example a disk or a memory or the like. The computer program code could be stored in the computer readable storage medium in the form of instructions encoding the computer-readable storage medium. The computer readable storage medium may be intended for taking part in the operation of a device, like an internal or external hard disk of a computer, or be intended for distribution of the program code, like an optical disc.

It is to be understood that also the computer program code by itself has to be considered an embodiment of the invention.

Any of the described apparatuses may comprise only the indicated components or one or more additional components.

Any of the described apparatuses for the first and second aspect may be a module or a component for a device, for example a chip. Alternatively, any of the described apparatuses for the first and second aspect may be a device, for instance a server, a mobile device or any device configured to evaluate data for positioning a mobile device.

In one embodiment, the described methods are information providing methods, and the described first apparatus for each aspect is an information providing apparatus. In one embodiment, the means of the described first apparatus for each aspect are processing means.

In certain embodiments of the described methods according to the first aspect, the methods are methods for encoding data. In certain embodiments of the described apparatuses according to the first aspect, the apparatuses are apparatuses for encoding data. In certain embodiments of the described methods according to the second aspect, the methods are methods for decoding data. In certain embodiments of the described apparatuses according to the second aspect, the apparatuses are apparatuses for decoding data.

Further, it is to be understood that the presentation of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE FIGURES

Figure 1:
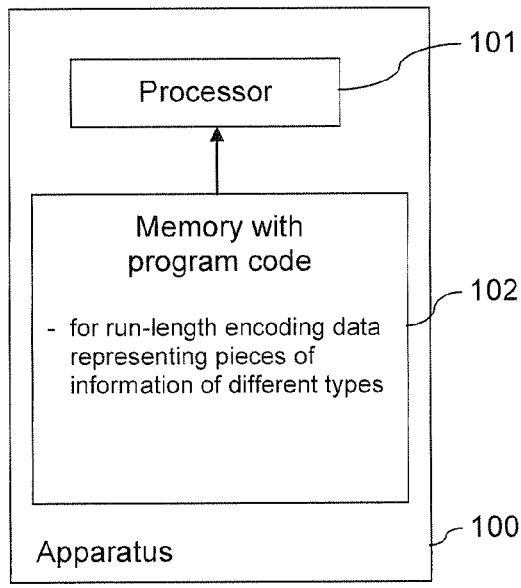
FIG. 1 is a schematic block diagram of a first apparatus.

FIG. 1 is a schematic block diagram of a first apparatus 100. Apparatus 100 comprises a processor 101 and, linked to processor 101, a memory 102. Memory 102 stores computer program code for run-length encoding data representing pieces of information of different types. Processor 101 is configured to execute computer program code stored in memory 102 in order to cause an apparatus to perform desired actions.

Apparatus 100 could be a server or any other device, for instance a mobile device. Such a mobile device could be for example a communication terminal, like a mobile phone, a smart phone, a laptop, a tablet computer, etc. Apparatus 100 could equally be a module for a server or for any other device, like an encoder, a codec, a chip, circuitry on a chip or a plug-in board. Apparatus 100 is an exemplary embodiment of any apparatus according to the first aspect of the invention. Optionally, apparatus 100 could have various other components, like a receiver, a transmitter, a transceiver, an antenna, a data interface, a user interface, a further memory, a further processor, etc.

An operation of apparatus 100 will now be described with reference to the flow chart of FIG. 2. The operation is an exemplary embodiment of a method according to the first aspect of the invention. Processor 101 and the program code stored in memory 102 cause an apparatus to perform the operation when the program code is retrieved from memory 102 and executed by processor 101. The apparatus that is caused to perform the operation can be apparatus 100 or some other apparatus, in particular a device comprising apparatus 100.

The apparatus run-length encodes data to obtain a sequence of records. The data are associated to grid points of a grid, and the records are defined such that they allow embedding data associated to a same grid point and representing pieces of information of at least two different types in a same record. (action 111)

The apparatus furthermore causes at least one of storage and transmission of the encoded data. (action 112)

Certain embodiments of the first aspect of the invention may thus enable an apparatus, which encodes data using run-length encoding (RLE) to obtain a sequence of records and the data are associate to grid points of a grid, to embed data, which are associated to a same grid point of the grid and which represent pieces of information of at least two different types, in a same record of the sequence of records. Thus, it may not be required to generate different RLE streams for each type of information that is associated to a grid, since even a single record for a single grid point may contain data representing pieces of information of different types. The encoded data could thus be sorted in a stream by association to grid points such that each grid point is considered only at one place in a stream.

Certain embodiments of the first aspect of the invention may have the effect that an efficient storage or transmission of grid data is enabled. The consumption of storage space or of bandwidth may be reduced in particular, when storing or transmitting potentially spatially sparse data with varying types of information.

Figure 2:
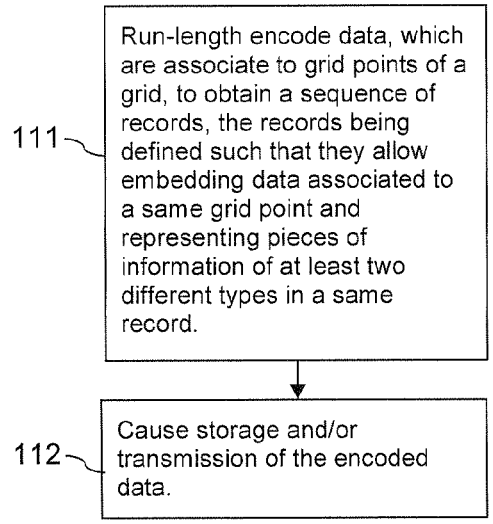
FIG. 2 is a flow chart illustrating a first method.

Apparatus 100 illustrated in FIG. 1 and the operation illustrated in FIG. 2 may be implemented and refined in various ways.

The employed grid could be defined in a spherical coordinate system, but equally in any other kind of coordinate system, for instance a Cartesian coordinate system.

The encoded data could be stored in apparatus 100, in any other apparatus that may be caused to perform the indicated operations of FIG. 2, or in an external memory.

In an exemplary embodiment of the first aspect of the invention, to each grid point of the grid no data, data representing pieces of information of a single type, or data representing pieces of information of at least two different types can be associated. Thus, the records may be defined such that they further allow embedding data associated to a grid point and representing pieces of information of a single type in a record, and/or indicating in a record that no data is associated to at least one grid point.

In an exemplary embodiment of the first aspect of the invention, each grid point corresponds to a location. The data may represent at least pieces of information corresponding to results of at least two different types of measurements. Thus, also the pieces of information of at least two different types that may be represented by data which is associated to a single grid point may correspond to results of at least two different types of measurements. It is to be understood, however, that data representing pieces of information of other types could be allowed to be included as well in the sequence of records and in a single record.

In an exemplary embodiment of the first aspect of the invention, the encoded data may be provided for supporting a terrestrial radio signal based positioning of mobile devices. The encoded data could be directly usable in some positioning algorithm. Alternatively, they could be an intermediate representation, that may be used for generating data in a further representation as a basis for the actual positioning. Such further representation may include for instance coverage areas and/or radio channel models.

The terrestrial radio signals can be signals of a cellular system, for instance a global system for mobile communications (GSM), a 3rd Generation Partnership Project (3GPP) based cellular system like a wide-band code division multiple access (WCDMA) system or a time division synchronous CDMA (TD-SCDMA) system, a 3GPP2 system like a CDMA2000 system, a long term evolution (LTE) or LTE-Advanced system, or any other type of cellular system, like a worldwide interoperability for microwave access (WiMAX) system. Alternatively or in addition, the terrestrial radio signals can be signals of a non-cellular system, like WLAN, Bluetooth and Zigbee, etc.

The term "measurements" is to be understood as a term of wide comprehension. The measurements may comprise for instance various types of measurements on terrestrial radio signals as well as any other type of measurements that may be associated to a location. Measurements on terrestrial radio signals may include, depending on the system, measurements of the signal strength of received signals, of the pathloss of received signals, of the timing advance of signals, of a round-trip timing of signals, etc. The data representing results of measurements on signals may include in addition some identification of a base station or access point from which the signals have been received and/or to which the signals have been transmitted. Other types of measurements could include for instance measurements performed by a grid point hit counter, resulting in values indicating how often samples are received for a given grid point. The mentioned results of at least two different types of measurements could thus comprise for example values indicating a signal strength on the one hand and the rates at which such values are received for different grid points on the other hand.

As mentioned above, the data is not limited to measurement results and associated data, though. It could equally include any other kind of data that can be associated to grid points of a grid. Such other kind of data could equally be linked to a particular geographical location in a geographical area, but a grid could also be provided for representing another area than a geographical area.

In an exemplary embodiment of the first aspect of the invention, the records are defined such that they allow including in a record at least one indication of at least one type of content of the record. This may have the effect that a decoding end knows what to expect. The type of content could also indicate the size of content. The type of content could furthermore define the size of content provided for each piece of information and/or the type of each piece of information and/or the order of the data representing the pieces of information in a record. This may have the effect that the content can be particularly flexible. It is to be understood that in some embodiments, records that are defined such that they allow including at least one indication of at least one type of content of a record in the record may equally allow omitting such indication in specified situations.

In an exemplary embodiment of the first aspect of the invention, the type of content may comprise at least one type of content for a number of subsequent grid points to which no data is associated. There may be different types for higher and lower numbers of such grid points. Alternatively or in addition, the type of content may comprise at least one type of content for data representing pieces of information of a single type, e.g. any of the above mentioned measurements. Alternatively or in addition, the type of content may comprise at least one type of content for data representing pieces of information of a plurality of types, e.g. any combination of the above mentioned measurements.

In an exemplary embodiment of the first aspect of the invention, the sequence of records comprises a separate record for each grid point, to which data is associated, and a separate record for each grid point, which is a first grid point in a sequence of grid points in a predetermined order of grid points to which no data is associated.

In a first exemplary alternative, such a record comprises an indication of a type of content of the record, the type specifying the size of the content, and content of the specified size. The content includes either data associated to the current grid point, or an indication of the number of subsequent grid points, starting with the current grid point, to which no data is associated.

In a second exemplary alternative, a record comprises a header with a first field and a second field. The first field indicates whether data is associated to the grid point. Whenever the first field indicates that no data is associated to the grid point, the second field indicates the number of subsequent grid points to which no data is associated. Whenever the first field indicates that data is associated to the grid point, the second field indicates a type of content, the type of content specifying the size of the content. Whenever the first field in the header indicates that data is associated to the grid point, the record further comprises content, the content including data associated to the grid point. This alternative may have the effect that no separate content may be required for grid points to which no data is associated, thus further reducing the amount of encoded data at least in some cases.

In a third exemplary alternative, a record comprises a header indicating a total size of content and content of the indicated total size. The content includes at least one indication of a type of at least one entity with partial content, the type specifying a size of the entity with the partial content, and at least one entity with partial content of the specified size. A partial content includes either data representing pieces of information of a single type associated to the grid point, or an indication of the number of subsequent grid points, starting with the grid point, to which no data is associated. This alternative may have the effect that it does not require defining each possibly required combination of pieces of information beforehand; it may further have the effect that it can easily be extended for use with pieces of information of additional types, since data representing pieces of information of a particular type may be included as respective separate partial content. It has to be noted that the total size of the content can be indicated explicitly or implicitly in the header. For example, if the header includes an indication of the total size of the record and the size of the header is known, the header implicitly indicates the total size of the content as the difference of the indicated total size of the record and the known size of the header.

In an exemplary embodiment of the first aspect of the invention, the encoded data may be generated and stored at a server for learning purposes, that is, for completing and/or updating a collection of grid data, and optionally or alternatively as a basis for positioning computations at the server. Further alternatively, the encoded data may be generated and stored at a mobile device. Further alternatively, it may be generated at a server and transmitted as detailed radiomap or learning information to a mobile device, where the data may be evaluated and/or stored. Further alternatively, the encoded data may be generated at a mobile device and transmitted as detailed radiomap or learning information to a server, where the data may be evaluated and/or stored.

The data that is associated to grid points of a grid may be for instance data that is considered to be valid for a particular location in a two-dimensional space or data that is considered to be valid for a particular location in a three-dimensional space. Some exemplary alternatives for encoding data that is considered to be valid for a particular location in a three-dimensional space will be presented in the following.

In an exemplary embodiment of the first aspect of the invention, the grid is a two-dimensional grid and each grid point corresponds to a location in a two-dimensional space. The data associated to the grid points of this grid are run length encoded. If the data associated to the grid points are further associated to a particular value of a third dimension, an indication of this value of the third dimension may be added to the encoded data. A dedicated parameter may be provided to this end. Thus, a separate set of encoded data may be generated for different values of the third dimension. The two-dimensional grid may be in particular a horizontal grid, and the third dimension may be in particular a vertical dimension defining an altitude, for instance an altitude in meters or a floor number of a building.

In an alternative exemplary embodiment of the first aspect of the invention, the grid is a three-dimensional grid and each grid point corresponds to a location in a three-dimensional space. The run-length encoding may then comprise run-length encoding the data using a predetermined order of grid points of the three-dimensional grid. Thus, a single set of encoded data may be generated for data associated to locations in a three-dimensional space. For this embodiment, an indication of the extent of the grid in at least two dimensions could be provided in addition to the encoded data, in order to enable a decoder to correctly reconstruct the three-dimensional distribution of the data. The extent of the grid could also be fixed, but a variable extent may have the effect that grids can be flexibly selected as needed, for instance by adjusting a covered area.

In a further alternative exemplary embodiment of the first aspect of the invention, each grid point corresponds to a location in a two-dimensional space. The pieces of information of at least two different types may then comprise information on at least one type of measurement and information on a value of a third dimension to which the information on the at least one type of measurement is associated. Thus, a single set of encoded data may be generated for data associated to locations in a two-dimensional space, while information on a third dimension may be provided as a part of the encoded data. The two-dimensional grid may be in particular a horizontal grid, and the third dimension may be in particular a vertical dimension defining an altitude.

Each of the alternatives may have the effect that variations with altitude of some data may be reflected in the encoding.

Figure 3:
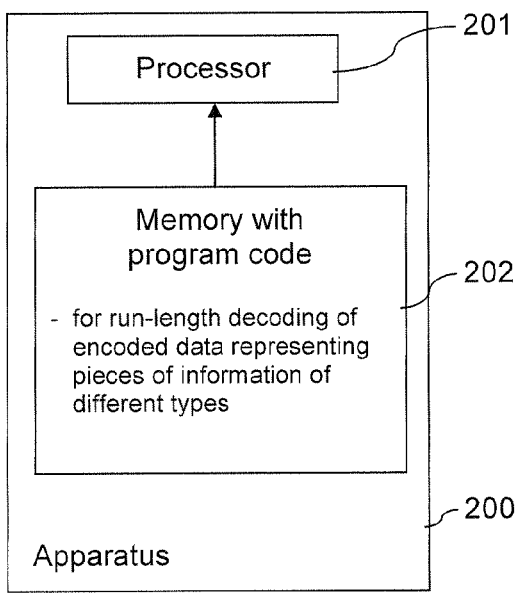
FIG. 3 is a schematic block diagram of a second apparatus.

FIG. 3 is a schematic block diagram of a second apparatus 200. Apparatus 200 comprises a processor 201 and, linked to processor 201, a memory 202. Memory 202 stores computer program code for run-length decoding data representing pieces of information of different types. Processor 201 is configured to execute computer program code stored in memory 202 in order to cause an apparatus server to perform desired actions.

Apparatus 200 could be for instance a server or any other device, for instance a mobile device. Such a mobile device could be for example a communication terminal, like a mobile phone, a smart phone, a laptop, a tablet computer, etc. Apparatus 200 could equally be a module for a server or for any other device, like a decoder, a codec, a chip, circuitry on a chip or a plug-in board. Apparatus 200 is an exemplary embodiment of an apparatus according to the second aspect of the invention. Optionally, apparatus 200 could have various other components, like a receiver, a transceiver, an antenna, a data interface, a user interface, a further memory, a further processor, etc.

An operation of apparatus 200 will now be described with reference to the flow chart of FIG. 4. The operation is an exemplary embodiment of a method according to the second aspect of the invention. Processor 201 and the program code stored in memory 202 cause an apparatus to perform the operation when the program code is retrieved from memory 202 and executed by processor 201. The apparatus that is caused to perform the operation can be apparatus 200 or some other apparatus, in particular a device comprising apparatus 200.

The apparatus receives or retrieves run-length encoded data in a sequence of records. The data are associate to grid points of a grid and data, which are associated to a same grid point of the grid and which represent pieces of information of at least two different types, are embedded in a same record of the sequence of records. (action 211). The apparatus further run-length decodes the data to obtain decoded data and an association of the decoded data to the grid points of the grid (action 212).

Certain embodiments of the second aspect of the invention may thus have the effect that the use of efficiently stored or transmitted grid data is supported.

Figure 4:
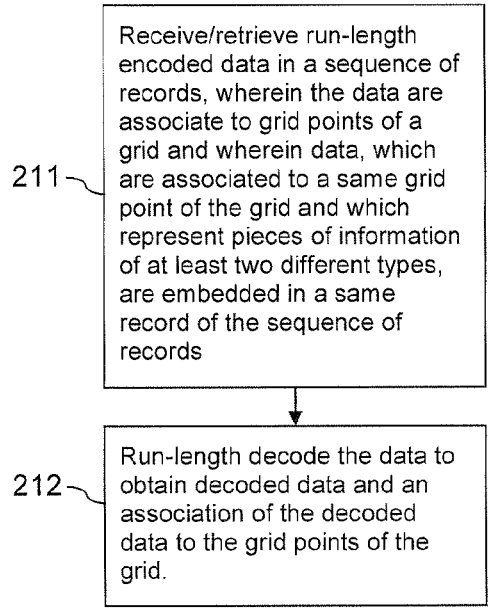
FIG. 4 is a flow chart illustrating a second method.

Apparatus 200 illustrated in FIG. 3 and the operation illustrated in FIG. 4 may be implemented and refined in various ways, in particular, though not exclusively, with features corresponding to any of the feature of the embodiments presented for apparatus 100 illustrated in FIG. 1 and the associated operation illustrated in FIG. 2.

If a two-dimensional distribution of data has been considered in the encoding, the data may be decoded to obtain a two-dimensional model of measurement results and/or other data. If a three-dimensional distribution of data has been considered in the encoding, the data may be decoded to obtain a three-dimensional model of measurement results and/or other data.

The encoded data could be received or retrieved from an external entity or retrieved within the apparatus, for example from a memory storing the encoded data.

The encoding and decoding operations presented with reference to FIGS. 2 and 4, respectively, could also be implemented in a single apparatus. This may have the effect that an apparatus that is able to encode and store data may be able to update stored or received data when additional data is received, to use stored data at a later point of time for some evaluation, or to provide the data to some other entity in decoded form. For such an apparatus, processor 101 and/or memory 102 of apparatus 100 could be used in addition for realizing the operations presented with reference to FIG. 4, by adding a corresponding program code to memory 102.

Figure 5:
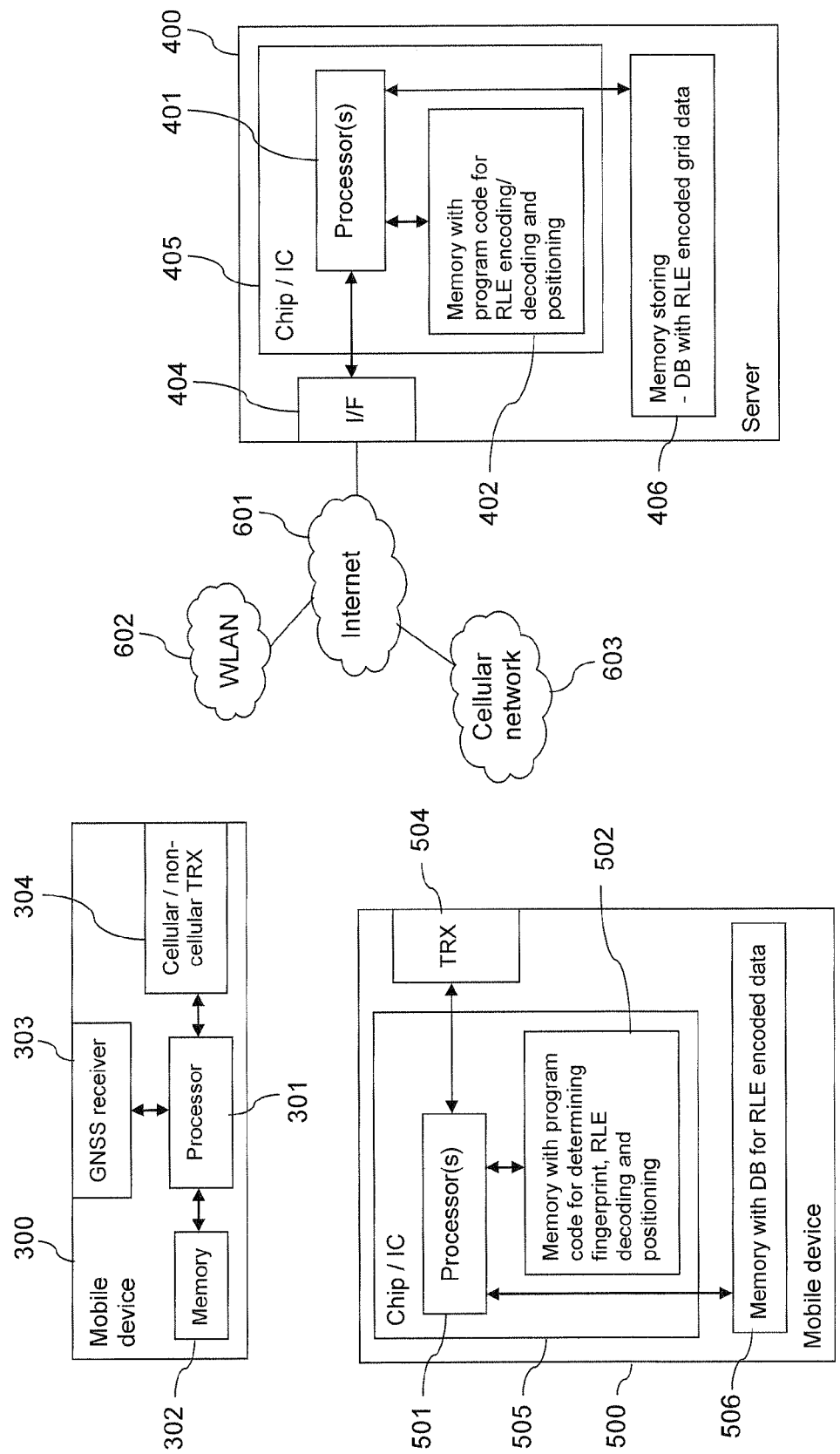
FIG. 5 is a schematic block diagram of a system.

FIG. 5 is a schematic block diagram of a system comprising an exemplary embodiment of an apparatus according to the combined first and second aspect of the invention, as well as an exemplary embodiment of an apparatus according to the second aspect of the invention.

The system comprises a first mobile device 300, a server 400 and a second mobile device 500. Server 400 is connected to a network 601, for example the Internet. Network 601 is suited to interconnect server 400 with mobile device 300 and mobile device 500 via WLANs 602 and/or via a cellular network 603. Server 400 could also belong to network 601.

Mobile device 300 could be for instance a communication terminal. It comprises a processor 301 that is linked to a memory 302, to a GNSS receiver 303 and to at least one radio interface 304.

GNSS receiver 303 is configured to receive satellite signals and to determine the position of mobile device 300 based on the satellite signals. It could be for example a global positioning system (GPS) receiver and/or a Galileo receiver. The at least one radio interface 304 could comprise for instance a transceiver (TRX) enabling an access to a cellular communication network 603, like a GSM or Universal Mobile Telecommunications System (UMTS) network, and/or a transceiver enabling an access to WLANs 602. Processor 301 is configured to execute computer program code, including computer program code stored in memory 302, in order to cause mobile device 300 to perform desired actions. Memory 302 stores computer program code for assembling data on a current location determined by GNSS receiver 303 and measurement results on signals received via radio interface 304.

Server 400 may be for instance a dedicated positioning server, a position data learning server, or some other kind of server. It comprises a processor 401 that is linked to a first memory 402, to a second memory 406 and to an interface (I/F) 404. Processor 401 is configured to execute computer program code, including computer program code stored in memory 402, in order to cause server 400 to perform desired actions.

Memory 402 stores computer program code for run-length encoding and decoding. The computer program code may comprise for example similar program code as memories 102 and 202. The program code could belong for instance to a comprehensive application supporting a learning of position data and/or a positioning of mobile devices. In addition, memory 402 may store computer program code implemented to realize other functions, as well as any kind of other data. It is to be understood, though, that program code for any other actions than run-length encoding and/or decoding that may be required in the context of a particular embodiment could also be implemented on one or more other physical and/or virtual servers.

Processor 401 and memory 402 may optionally belong to a chip or an integrated circuit 405, which may comprise in addition various other components, for instance a further processor or memory.

Memory 406 stores at least one database that can be accessed by processor 401. The database is configured to store run-length encoded grid data. In addition, memory 406 could store other data, for instance other data supporting a positioning of mobile devices. It is to be understood that the memory storing the database could also be external to server 400; it could be for instance on another physical or virtual server.

Interface 404 is a component which enables server 400 to communicate with other devices, like mobile devices 300 and 400, via network 601. Interface 404 could comprise for instance a TCP/IP socket.

Component 405 or server 400 could correspond to exemplary embodiments of an apparatus according to the first and second aspect of the invention.

Mobile device 500 could equally be a communication terminal. It comprises a processor 501 that is linked to a first memory 502, to a second memory 506 and to at least one radio interface 504. It could comprise various other components not shown, like a GNSS receiver and a user interface, etc.

Processor 501 is configured to execute computer program code, including computer program code stored in memory 502, in order to cause mobile device 500 to perform desired actions.

Memory 502 stores computer program code for RLE decoding. The computer program code may comprise for example similar program code as memory 202. The program code could belong for instance to a comprehensive positioning application stored in memory 502, which may support in addition a determination of data based on signal measurements and a computation of a current position. In addition, memory 502 may store computer program code implemented to realize other functions, as well as any kind of other data.

Processor 501 and memory 502 may optionally belong to a chip or an integrated circuit 505, which may comprise in addition various other components, for instance a further processor or memory or a part of transceiver 504, etc.

Memory 506 stores a database which can be accessed by processor 501. The database is suited to store RLE encoded grid data. Memory 506 may be for example an integrated memory of mobile device 500 or an exchangeable memory card.

Radio interface 504 could comprise for instance a transceiver enabling an access to a cellular communication network 603, like a GSM or Universal Mobile Telecommunications System (UMTS) network, and/or a transceiver enabling an access to WLANs 602. In addition, mobile device 500 could comprise a GNSS receiver (not shown).

Component 505 or mobile device 500 could correspond to an exemplary embodiment of an apparatus according to the second aspect of the invention.

Each WLAN 602 provides one or more access points for enabling mobile devices to communicate with server 400 via network 601, and cellular networks 603 provide base transceiver stations enabling mobile devices to communicate with server 400 via network 601.

An exemplary operation in the system of FIG. 5 will now be described with reference to the flow chart of FIG. 6.

Figure 6:
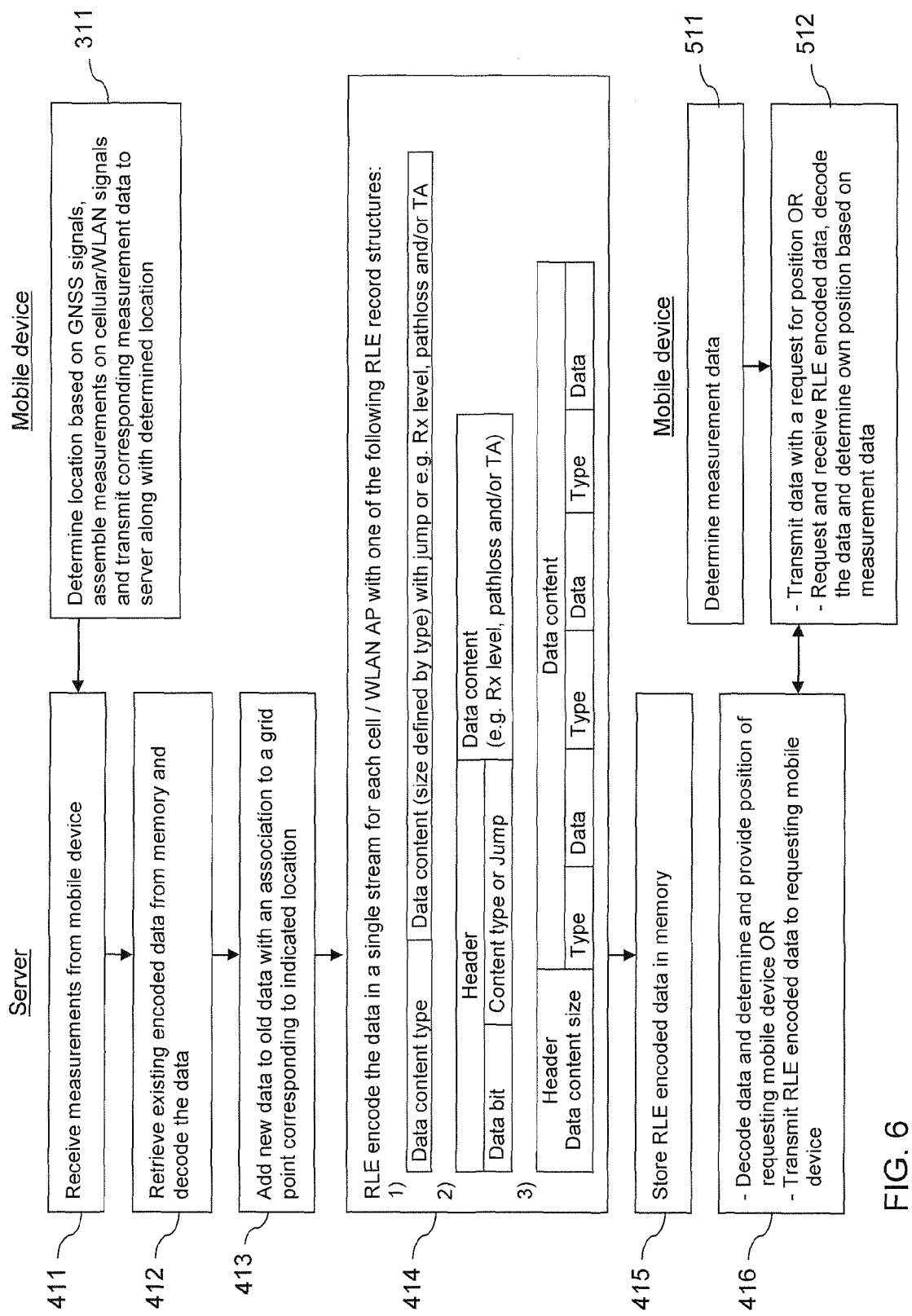
FIG. 6 is a flow chart illustrating an exemplary operation in the system of FIG. 5.

Operations at server 400 are presented on the left hand side of FIG. 6. Processor 401 and the program code stored in memory 402 cause server 400 to perform the presented operations when the program code is retrieved from memory 402 and executed by processor 401. Operations at mobile device 300 are presented at the top on the right hand side of FIG. 6. Processor 301 and the program code stored in memory 302 cause mobile device 300 to perform the presented operations when the program code is retrieved from memory 302 and executed by processor 301. Operations at mobile device 400 are presented at the bottom on the right hand side of FIG. 6. Processor 401 and the program code stored in memory 402 cause mobile device 400 to perform the presented operations when the program code is retrieved from memory 402 and executed by processor 401.

Mobile device 300 receives satellite signals via GNSS receiver 303 and determines its current position. In addition, the at least one transceiver 304 of mobile device 300 detects signals transmitted by access points (AP) of one or more WLANs 602 and/or by one or more base stations of a cellular network 603. Mobile device 300 assembles measurements on these signals, associating an identification (ID) of the observed entity, for instance a cell ID or a WLAN AP ID, to each measurement. Mobile device 300 then transmits the measurements and the associated IDs along with the determined position as a fingerprint to server 400. (action 311) The transmission may take place via WLAN 602 and network 601 or via cellular network 603 and network 601. It has to be noted that in an alternative embodiment, the position of mobile device 300 could also be determined based on some other positioning technology than GNSS. For instance, if a mobile device collects measurements on cellular radio signals for transmission to a server, the mobile device could determine its position based on WLAN signals instead of GNSS signals.

Server 400 provides a learning system for building up and updating a positioning data learning database, for instance a fingerprint database. The database comprises a separate RLE stream for each WLAN AP and/or for each cell for which measurements have been provided so far. Sever 400 receives assembled measurements from mobile device 300. (action 411) Similar data may be received from other mobile devices.

Server 400 determines the WLAN AP IDs and/or cell IDs belonging to the received measurements, and retrieves corresponding RLE streams from memory 406, as far as available. Each RLE stream is included in an object identifying the respective WLAN AP or cell so that a parser is able to select the appropriate RLE streams. Server 400 then decodes the retrieved data. (action 412).

Figure 7:
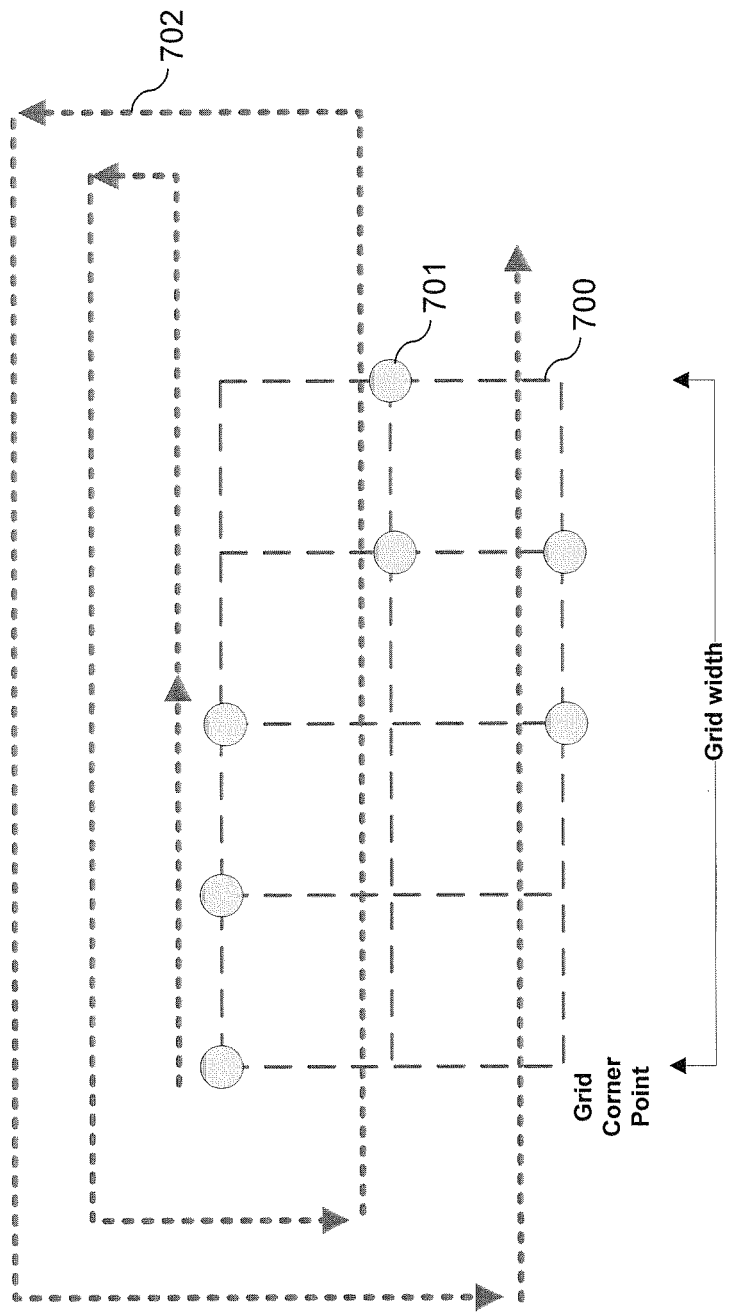
FIG. 7 is a diagram illustrating a grid with data associated to grid points of a grid.

The data of each decoded stream is associated to grid points of a grid, as shown for a section of a grid in FIG. 7. Each dot 701 represents data that is associated to a particular grid point of grid 700. As can be seen, not all grid points have data associated to them. This is a typical situation with community-collected data, in which the data is usually sparse. Samples come in, for instance, from along the roads and walking paths, and less from forest areas and the like. Thus, although a cellular network cell might cover for instance 10 km², the actually received samples are likely to cover only a fraction of the area. This means that between the samples, there is a considerable amount of "empty area" without available measurement results.

In order to work with such a grid, the size of the grid, the grid density and a corner point of the grid, as the origin of the grid, have been set to suitable, known values. By way of example, the grid size in latitude direction (North-South) may be denoted as $\epsilon_y$, and in longitudinal direction (East-West) as $\epsilon_x$. Further, the grid corner point may be defined to be the lower-left corner (LAT$_0$, LON$_0$).

Server 400 maps the location in the data received from mobile device 300 to the closest grid point.

For instance, an incoming data with coordinates (LAT, LON) can be mapped to the grid point (x,y) as follows:

$x$=ROUND([LON−LON$_0$]/$\epsilon_x$)

$y$=ROUND([LAT−LAT$_0$]/$\epsilon_y$)

When the grid point is found, the data can be associated as new data to this grid point or replace/update the data that was associated so far to this grid point of a respective grid. In case no data had been available so far for one of the IDs associated to the received measurements, a new grid is generated for this ID, and the new data is associated as first data of the grid to the determined grid point. (action 413) In addition, server 400 could generate own measurement results, like grid point hit rates, which can equally be used for adding or updating corresponding grid data.

Next, server 400 encodes the data again by generating a new RLE stream for each grid and thus for each cell and/or WLAN AP for which measurements were provided. (action 414)

The amount of data is huge so that the method of storing the data should be storage-efficient To exemplify, consider again a cellular network cell having a typical size of 10 km². Assuming that for the model generation the system stores samples in a uniform 50-meter grid, the number of data samples to be stored of the cell is in the order of 4000.

Data associated to grid points as presented in FIG. 7 could be encoded in an efficient manner by run-length encoding. To this end, it has to be defined in which order the grid points are considered. One option is starting from the upper-left corner of the grid, and moving on downwards row by row, as indicated by the dashed lines 702 with arrows in FIG. 7. In order to decode the RLE stream back to the original grid, not only the used order, but also the width of the grid has to be known, in order to enable a switch of line at the correct instances.

If the data provided by mobile devices was always of the same type, the indicated order could result in the following stream of data: {{data}, {data}, {data}, {jump 5}, {data}, {data}, {jump 2}, {data}, {data}} The term "jump" means that a number of subsequent grid points indicated by the following number contains no data. Thus, the run-length encoding is suited to solve the issue of a large amount of data comprising much empty space by coding the empty grid points in an RLE stream, since such indication does not consume much data.

Such run-length encoding assumes that the data is similar throughout the grid, though. However, the data can be more comprehensive and thus more valuable for positioning purposes, if the measurements provided by mobile devices may vary from sample to sample. For instance, some may include a signal strength measurement, some a timing advance measurement, some both, etc.

Figure 8:
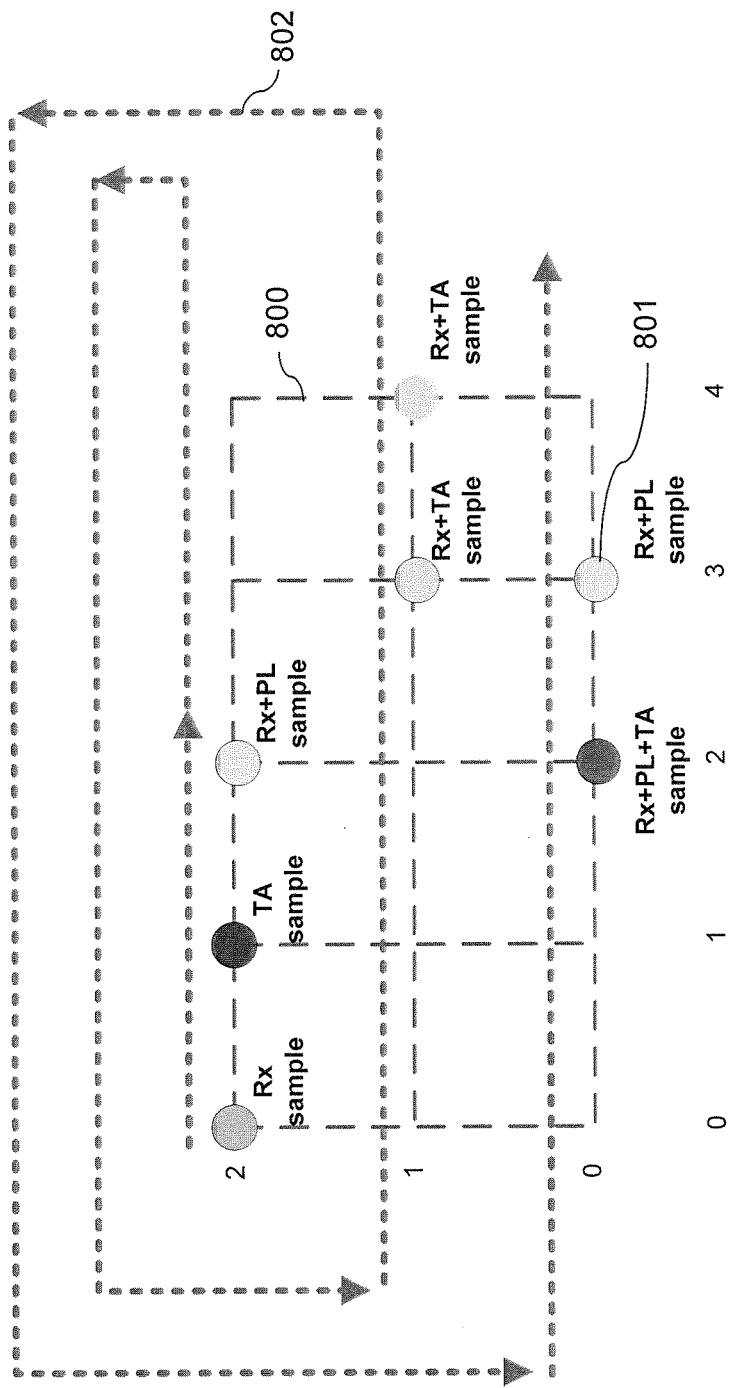
FIG. 8 is a diagram illustrating a grid with data representing pieces of information of different types associated to grid points of a grid.

FIG. 8 is a diagram illustrating a section of a grid 800 with data representing pieces of information of different types associated to grid points of the grid. The grid can be considered as a co-ordinate system with values 0, 1, 2, 3, 4 as possible co-ordinates in x-direction and values 0, 1, 2 as possible co-ordinates in y-direction. In action 411, sever 400 may receive a measurement of the Rx level from a location corresponding to grid point (0,2), the measurement being added in action 413 to previously received data. The previously received data may comprise a TA measurement from a location corresponding to grid point (1,2), Rx level and pathloss measurements from a location corresponding to grid point (2,2), Rx level and TA measurements from locations corresponding to grid points (3,1) and (4,1), Rx level, pathloss and TA measurements from locations corresponding to the grid points (2,0), and Rx level and pathloss measurements from a location corresponding to grid point (3,0).

One option to store such data in a database is to generate a separate run-length encoded stream for each type of measurement, that is, one stream for Rx levels, one stream for pathloss measurements, one steam for TA measurements, etc.

In the following, three alternative coding schemes using run-length encoding are presented that may be used by server 400 to encode the described multi-data-grid in a more efficient manner in a single stream. In each case, the stream may comprise a sequence of records, each record including an indication of a number of grid points for which no data is available, data representing measurements of a single type, or data representing measurements of a plurality of types.

Alternative 1

In this first alternative, the data in each record is structured such that the first byte specifies the content type and that the following n bytes contain the data content:

| Content type (1 byte) | Data content (n bytes) |
| --- | --- |

The content type implicitly specifies the content size as well. As a result, it is straightforward for a parser to decode the resulting binary RLE stream from a file, disk or memory.

By way of example, there may be seven different content types, which may be defined as presented in the following table:

| Content Type | Content | Size of data content | Details |
| --- | --- | --- | --- |
| 0x01 | Small jump data | 1 | $1^{st}$ byte: Number of grid points to be jumped, range [1, 256] |
| 0x02 | Large jump data | 2 | $1^{st}$-$2^{nd}$ bytes: Number of grid points to be jumped, range [1, 65536] |
| 0x03 | Rx data | 1 | $1^{st}$ byte: Rx level measurement<br>GSM: Rx level<br>WCDMA: Received Signal Code Power (RSCP)<br>TD-SCDMA: RSCP<br>LTE: Received Signal Received Power (RSRP)<br>WLAN: Rx level |
| 0x04 | Rx + PL data | 2 | $1^{st}$ byte: Rx level measurement<br>$2^{nd}$ byte: Pathloss measurement<br>GSM: Not Applicable<br>WCDMA: RSCP + Pathloss Measurement<br>TD-SCDMA: RSCP + Pathloss Measurement<br>LTE: Not applicable<br>WLAN: Not applicable |
| 0x05 | TA data | 2 bytes | $1^{st}$-$2^{nd}$ bytes: Timing Advance measurement<br>GSM: Timing Advance<br>WCDMA: Not Applicable<br>TD-SCDMA: Timing Advance<br>LTE: Timing Advance<br>WLAN: Not applicable |
| 0x06 | Rx + TA data | 3 | $1^{st}$ byte: Rx level measurement<br>$2^{nd}$-$3^{rd}$ bytes: Timing Advance measurement<br>GSM: Rx level + Timing Advance<br>WCDMA: Not Applicable<br>TD-SCDMA: RSCP + Timing Advance<br>LTE: RSRP + Timing Advance<br>WLAN: Not applicable |
| 0x07 | Rx + PL + TA data | | $1^{st}$ byte: Rx level measurement<br>$2^{nd}$ byte: Pathloss measurement<br>$3^{rd}$-$4^{th}$ bytes: Timing Advance measurement<br>GSM: Not Applicable<br>WCDMA: Not Applicable<br>TD-SCDMA: RSCP + Pathloss + Timing Advance<br>LTE: Not applicable<br>WLAN: Not applicable |

The "Size of data content" indicated the number of bytes that is provided for the content. The table lists in the "Details" column for each considered type of measurement—Rx level measurement, pathloss measurement and timing advance measurement—and their allowed combinations as well the corresponding terminology for GSM, WCDMA, TD-SCDMA, LTE and WLAN, as far as applicable.

Following the above convention and the order of the grid points indicated in FIG. 8 by the dashed line 802 with arrows, the binary RLE stream for the grid of FIG. 8 would be:

```
RLE = {
  { 0x03, Rx data},
  { 0x05, TA data},
  { 0x04, Rx+PL data},
  { 0x01, 5},
  { 0x06}, Rx+TA data},
  { 0x06}, Rx+TA data},
  { 0x01, 2},
  { 0x07, Rx+PL+TA data},
  { 0x04, Rx+PL data}
}
```

Alternative 2

The second alternative is a variant of the first alternative. In this alternative, the data in each RLE record is structured such that the first byte is a header part in which the highest bit denotes whether the seven remaining bits specify a jump or the content type:

| Header (1 byte) | | Data content (n bytes) |
| --- | --- | --- |
| Data bit [1 bit] | Content type or Jump [7 bits] | |

In case the highest bit of the header is set, the seven least significant bits (LSBs) specify the content type. In case the bit is not set, the seven LSBs specify the jump.

As in the previous example, the content type implicitly specifies the content size as well, to ensure that it is straightforward for the parser to decode the binary RLE stream from the file, disk or memory.

By way of example, there may be five different content types, which may be specified as presented in the following table:

| Content Type | Contents | Size of data content | Details |
|---|---|---|---|
| 0x01 | Rx data | 1 | 1st byte: Rx level measurement<br>GSM: Rx level<br>WCDMA: Received Signal Code Power (RSCP)<br>TD-SCDMA: RSCP<br>LTE: Received Signal Received Power (RSRP)<br>WLAN: Rx level |
| 0x02 | Rx + PL data | 2 | 1st byte: Rx level measurement<br>2nd byte: Pathloss measurement<br>GSM: Not Applicable<br>WCDMA: RSCP + Pathloss Measurement<br>TD-SCDMA: RSCP + Pathloss Measurement<br>LTE: Not applicable<br>WLAN: Not applicable |
| 0x03 | TA data | 2 | 1st-2nd bytes: Timing Advance measurement<br>GSM: Timing Advance<br>WCDMA: Not Applicable<br>TD-SCDMA: Timing Advance<br>LTE: Timing Advance<br>WLAN: Not applicable |
| 0x04 | Rx + TA data | 3 | 1st byte: Rx level measurement<br>2nd-3rd bytes: Timing Advance measurement<br>GSM: Rx level + Timing Advance<br>WCDMA: Not Applicable<br>TD-SCDMA: RSCP + Timing Advance<br>LTE: RSRP + Timing Advance<br>WLAN: Not applicable |
| 0x05 | Rx + PL + TA data | | 1st byte: Rx level measurement<br>2nd byte: Pathloss measurement<br>3rd-4th bytes: Timing Advance measurement<br>GSM: Not Applicable<br>WCDMA: Not Applicable<br>TD-SCDMA: RSCP + Pathloss + Timing Advance<br>LTE: Not applicable<br>WLAN: Not applicable |

The "Size of data content" indicates again the number of bytes provided for the content. Following the above convention, the binary RLE stream for the grid of FIG. 8 would be:

```
RLE = {
  { {data bit set, 0x01 }, Rx data },
  { {data bit set, 0x03 }, TA data },
  { {data bit set, 0x02 }, Rx+PL data},
  { data bit off, 5},
  { {data bit set, 0x04}, Rx+TA data},
  { {data bit set, 0x04}, Rx+TA data},
  { data bit off, 2},
  { {data bit set, 0x05}, Rx+PL+TA data},
  { {data bit set, 0x02}, Rx+PL data}
}
```

It may be noted that this definition allows only for 1-128 jumps at a time, which are the number of jumps that may be represented with the seven least significant bits of the header. If a larger number of bits is to be covered, it would be an option is to define a sixth content type 0x06 "Jump data" with the data content size of 2 bytes, allowing for jumping up to 65536 grid points, if necessary.

This second alternative has the effect that only a single byte may be needed for jump data, while in the first alternative any jump data may consume at least two bytes.

Alternative 3

In this third alternative, a header part of one byte of each RLE record defines the size of the content associated with the record, excluding the 1 byte of the header. In this manner the parser decoding the RLE binary stream knows, when the respective next RLE record, and more specifically the next header of the next RLE record, begins. It is to be understood that in a variation of this alternative, the one byte of the header could be included in the indicated size as well.

The header is followed by at least one data payload block consisting of a partial content type (first byte) followed by the actual partial data:

| | Data content (n bytes) | | | | | |
|---|---|---|---|---|---|---|
| Header data content size (without header) (1 byte) | Type (1 byte) | Data (k bytes) | Type (1 byte) | Data (1 bytes) | Type (1 byte) | Data (m bytes) |

Note that as in the previous example, the content type indication implicitly defines the size of the data block so that the parser knows when the next indication of a content type is to be expected within the record.

By way of example, there may be five different content types that may be specified as follows:

| Content Type | Contents | Size of data content | Details |
|---|---|---|---|
| 0x01 | Small jump data | 1 | 1st byte: Number of grid points to be jumped,<br>range [1, 256] |
| 0x02 | Large jump data | 2 | 1st-2nd bytes: Number of grid points to be jumped,<br>range [1, 65536] |
| 0x03 | Rx data | 1 | 1st byte: Rx level measurement<br>GSM: Rx level<br>WCDMA: Received Signal Code Power (RSCP)<br>TD-SCDMA: RSCP<br>LTE: Received Signal Received Power (RSRP)<br>WLAN: Rx level |
| 0x04 | PL data | 2 | 1st byte: Pathloss measurement<br>GSM: Not Applicable<br>WCDMA: Pathloss Measurement<br>TD-SCDMA: Pathloss Measurement<br>LTE: Not Applicable<br>WLAN: Not applicable |
| 0x05 | TA data | 2 | 1st-2nd bytes: Timing Advance measurement<br>GSM: Timing Advance<br>WCDMA: Not Applicable<br>TD-SCDMA: Timing Advance<br>LTE: Timing Advance<br>WLAN: Not applicable |

Following the above convention, the binary RLE stream for the grid of FIG. 8 would be:

```
RLE = {
  { 2, {0x03, Rx data} },
  { 3, {0x05, TA data} },
  { 4, {0x03, Rx data}, {0x04, PL data} },
  { 2, {0x01, 5} },
  { 5, {0x03, Rx data}, {0x05, TA data} },
  { 5, {0x03, Rx data}, {0x05, TA data} },
  { 2, {0x01, 2} },
```

-continued

```
{ 7, {0x03, Rx data}, {0x04, PL data}, {0x05, TA data} },
{ 4, {0x03, Rx data}, {0x04, PL data} }
}
```

In the above notation, the first number in each record indicates the number of bytes of the record that are present in addition to the one byte for the record header. For example, the {2, {0x03, Rx data}} notation means that the data in the RLE record takes two bytes in addition to the RLE record header, one byte for a content type and one byte for the content. In this case, the partial content is identical to the entire content, since there is only one type of measurement.

It is to be understood that the definitions presented for the three alternatives may not be exhaustive and may also be varied in many aspects otherwise; they are just presented to show the general idea of the first, second and third alternative.

Once the supplemented data has been encoded again, server 400 may store the encoded data in the database in memory 406. (action 415) The presented encoding allows keeping the measurement data in a compact format.

Depending on the implementation, the grid data can be used directly in positioning computations, or they can be used for example for updating further models, like radio channel models and/or coverage area models. In the latter case, available further models may updated at certain points of time based on the available grid data, for instance periodically or whenever there are updates to a grid, or depending on some other condition.

If mobile device 500 now wants to obtain an estimate of its own position based on terrestrial radio signals, it may carry out measurements on cellular and/or WLAN radio signals at its current location to determine data corresponding to the data of a fingerprint. (action 511)

Then, it may transmit the determined data to server 400 along with a request for positioning. (action 512)

Sever 400 receives the request and decodes appropriate RLE streams from memory 406 based on global cell IDs and WLAN AP IDs that are provided by mobile device 500 along with the measurements. The streams can be decoded easily, even though they contain pieces of information of different types in a single stream, because the general structure of the records is known, for instance as described above as one of alternatives 1, 2 or 3. Server 400 may then determine a grid point at which measurement values can be expected that correspond to the received measurement data, and provide location information corresponding to this grid point to mobile device 500 as the estimate of the current location of mobile device 500. (action 416) If the positioning is configured to be based on further models instead, a position at which measurement values can be expected that correspond to the received measurement data is determined based on the updated further models.

Alternatively, mobile device 500 could request in action 512 encoded RLE streams from server 400. Server 400 may then simply retrieve the encoded RLE streams from memory 406 and transmit the data to mobile device 500 in RLE encoded form. It is to be understood that instead of the entire grid data stored in memory 406, only a subset of the grid data could be provided. If the server stores for instance Rx level, timing advance and pathloss measurements, the server might send for example only Rx level and pathloss data to mobile device 500. This may require a decoding, an adjustment and a new encoding of the data, though. Mobile device 500 may then decode the RLE encoded data to obtain fingerprints associated to grid points. Based on the decoded data, mobile device 500 may determine a grid point at which measurement values can be expected that correspond to the measurement data determined in action 511. The associated grid point can then be used as an estimate for the current location of mobile device 500. In addition, mobile device 500 may store the encoded stream as received in memory 506. This may have the effect that mobile device 500 may determine its location independently again while moving along, as long as it stays in an area covered by the received data. In order to obtain a more extensive independency, mobile device 500 could also request and receive available RLE streams for a larger area.

Alternatively, also mobile device 500 could use further stored models as a basis for positioning operations, and update these further models based on the received and decoded RLE streams.

For the above approach, it is assumed that mobile device 500 knows or receives information on the grid corner point, the grid width and the grid size for each grid for which data is provided, as well as the order in which the grid points have been considered for the encoding.

It has to be noted that also a mobile device with GNSS capability may benefit from using cellular/non-cellular positioning technologies, in order to accelerate the time-to-first-fix using the obtained location as reference location, or in order to reduce the power consumption.

The proposed encoding is very flexible in terms of what the grid can contain and at what granularity. To exemplify this, consider a scenario in which a mobile device collects Rx measurements at a grid granularity of $\epsilon$ and TA information at a granularity of $4\epsilon$. Such data can also be easily carried in the embedded RLE scheme.

Certain embodiments of the invention may thus have the effect of enabling an efficient storage or transmission of data that is mapped to grid points of a grid, if the data may represent pieces of information of different types.

The structures presented for alternatives 1, 2 and 3 are based on the assumption that separate RLE streams are provided for measurements on signals for each cell or access point (or any other type of radio access entity or coverage area of a system). It is to be understood, though, that it would also be possible to distribute the measurements differently to different RLE streams. It would be possible, for instance, to define a single structure for measurements on signals in two or more systems in a predetermined area by specifying additional content types for each possible combination. Furthermore, the structures presented for alternatives 1, 2 and 3 are based on the assumption that a certain type of measurement is represented only once at most for a respective grid point. It is to be understood, though, that it would also be possible to define a structure which allows representing measurements of a certain type for a single grid point by a variable amount of data. For instance, a mobile device may receive at a particular location signals from one, two or more cells of a cellular system or signals from one, two or more WLAN access points. Thus, different content types could be defined for different numbers of cells or access points for which measurements are obtained and provided. In theory, it would even be possible to have a single grid containing all data. Using a plurality of grids has the effect, though, that it is not necessary to decode and encode all of the available data for each update or use.

In the embodiments presented above with reference to FIG. 6, it has been assumed that data is provided for locations that can be represented by a two-dimensional grid, for instance a grid covering a portion of the surface of earth. In most outdoor scenarios, it may be sufficient to store positioning data in a two-dimensional grid. Indoor spaces, however, are inherently three-dimensional due to the existence of different floors. On the one hand, measurement results may be quite different on different floors at the same longitude and latitude co-ordinates so that the quality of positioning based on a two-dimensional grid may be low. On the other hand, a two-dimensional grid does not allow for a positioning that provides in addition an indication of the altitude or floor on which a user is located.

Figure 9:
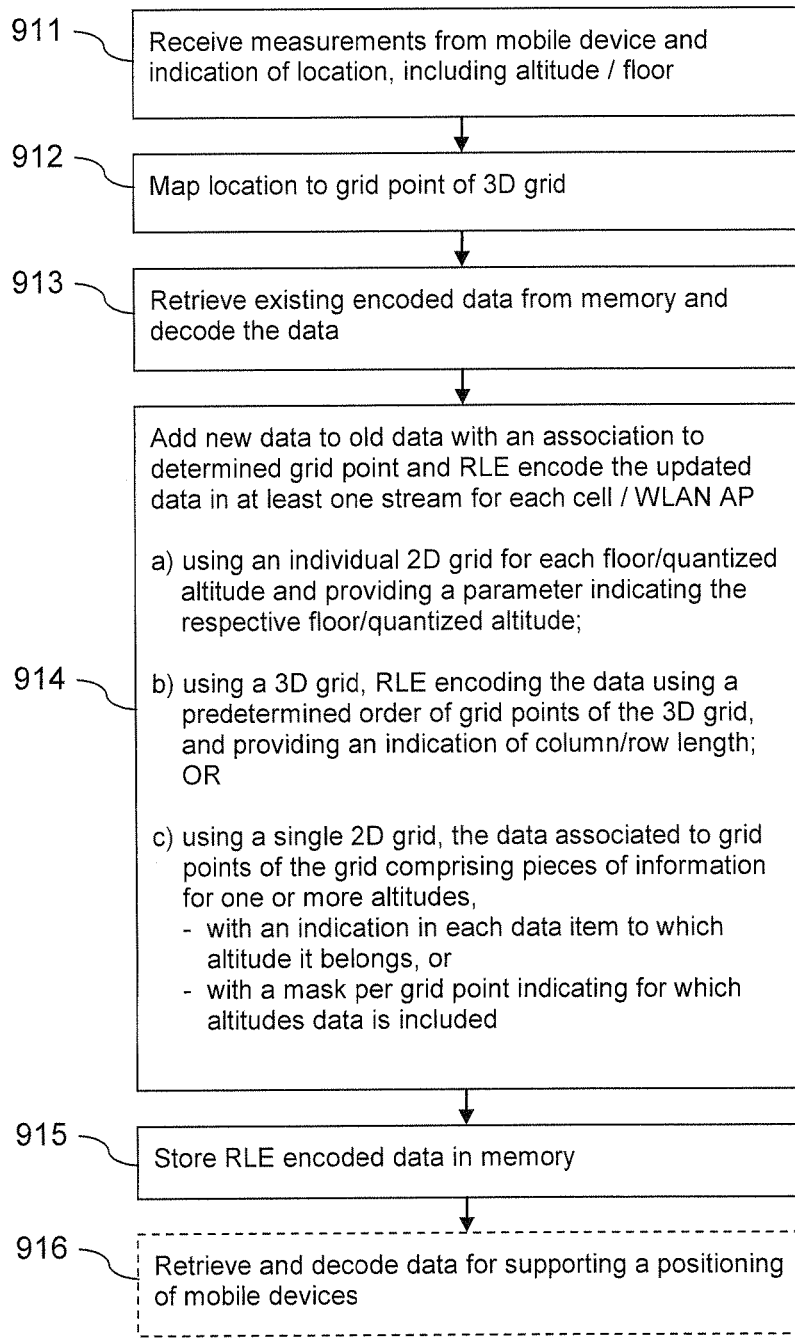
FIG. 9 is a flow chart illustrating a further exemplary operation in the system of FIG. 5.

Exemplary embodiments taking account of a third dimension will be presented in the following with reference to FIG. 9. FIG. 9 is a flow chart illustrating a further exemplary operation at server 400.

Server 400 receives a fingerprint message from a mobile device, which includes data and an identification of a WLAN AP and/or cell for which the data is valid. The data may comprise measurement results, like RX levels measured at the indicated location, and other data. The message further includes an indication of a location of the mobile device. The indication of the location comprises components for three dimensions. (action 911)

The components for the first two dimensions may be longitude and latitude values. The component for a vertical third dimension can be provided in the form of continuous altitude values, for instance in meters from the sea level or from some other reference altitude, or in the form of discrete values, for instance the floor numbers of a building.

Server 400 maps the indicated location to a grid point of a three-dimensional grid. (action 912)

In case continuous altitude values are used, an incoming fingerprint with coordinates (LAT, LON, h) can be mapped to the grid point (x,y,z) with:

$x=\text{ROUND}([\text{LON}-\text{LON}_0]/\epsilon_x)$ $y=\text{ROUND}([\text{LAT}-\text{LAT}_0]/\epsilon_y)$ $z=\text{ROUND}([h-h_0]/\epsilon_z)$ As in the example for the two-dimensional grid, $\epsilon_x$ may represent the grid size in longitudinal direction, $\epsilon_y$ may represent the grid size in latitude direction, LON may be a longitude value, LAT may be a latitude value, and (LAT$_0$, LON$_0$) may be the lower-left corner of a two-dimensional horizontal grid. In addition, h may be the altitude at which measurements were performed, $h_0$ may be a reference altitude, which can be chosen arbitrarily, and $\epsilon_z$ may represent the grid size in vertical direction.

Alternatively, in case floor numbers are used, an incoming fingerprint with coordinates (LAT, LON, floor) can be mapped to the grid point (x,y,floor) with:

$x=\text{ROUND}([\text{LON}-\text{LON}_0]/\epsilon_x)$ $y=\text{ROUND}([\text{LAT}-\text{LAT}_0]/\epsilon_y)$ z=floor It can be seen that both alternatives are suited for a grid-based approach.

Server 400 determines the WLAN AP IDs and/or cell IDs belonging to the received data, and retrieves corresponding RLE streams from memory 406, as far as available. Server 400 then decodes the retrieved data to obtain a three-dimensional model of data. (action 413)

If no data had been available for far for a particular WLAN AP or cell for which data is received, a new empty three-dimensional grid is set up.

Server 400 adds the new data to the old data with an association to a grid point corresponding to the indicated location and encodes the data in at least one stream for each cell and/or WLAN AP. (action 914) If new data is associated to a grid point for which old data had been available, the new data may replace the old data or be combined with the old data.

Three exemplary options for performing a run-length encoding of data taking account of three dimensions will be presented.

Figure 10:
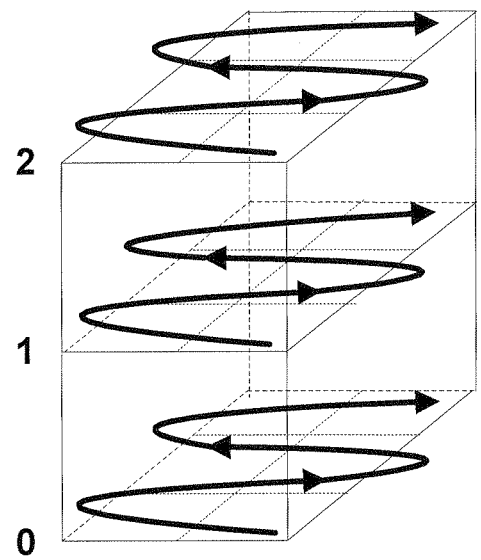
FIG. 10 is a diagram illustrating an exemplary handling of data that are associated to grid points of a three-dimensional grid.

A first option is illustrated in FIG. 10. FIG. 10 is a diagram schematically presenting a first grid for ground floor 0, a second grid for a first floor 1 and a third grid for a second floor 2. Together, the three grids for all floors thus form a three-dimensional grid. To each grid point, either no data or one or more pieces of information are assigned. The pieces of information may include for instance Rx level, pathloss and TA measurement, etc.

A run length encoding is performed separately for each floor (0, 1, 2), resulting in three separate RLE streams. The individual RLE streams can be obtained in the same manner as described with reference to FIG. 8 for a two-dimensional grid. Instead of scanning all rows from left to right from top to bottom as shown in these Figures, any other order would be possible as well. This is illustrated by the depicted variation in FIG. 10, in which the rows are scanned by way of example back and forth from bottom to top. The employed record structure may be the same as one of the record structures described with reference to FIG. 6. The only addition required for this option is including the information on the floor number with the respective RLE stream. In case there is no data from some floor, there may be no RLE stream for this floor.

Now, when new data are received in action 911 and mapped to a particular floor in action 912, only the RLE stream for this floor may be extracted from memory 406 and decoded in action 913. In action 914, the new data is used for updating the old decoded data for this floor, and a new RLE stream is generated for this floor by encoding the updated data and by adding again a parameter indicating the floor to the RLE stream.

In case the received message from the mobile device comprises a continuous altitude value instead of a floor number, a parameter representing a quantized altitude value can be added to a respective RLE stream instead of the floor number.

Figure 11:
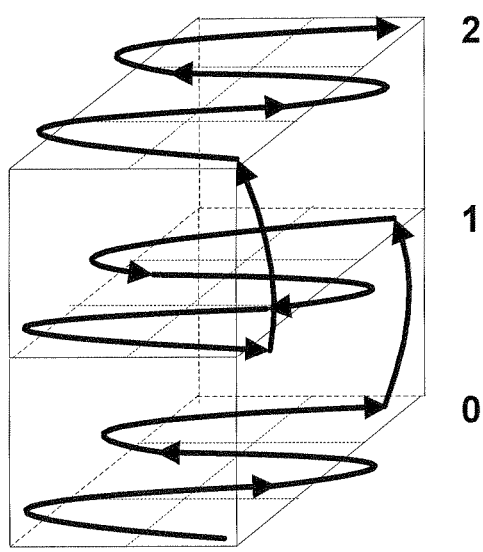
FIG. 11 is a diagram illustrating a further exemplary handling of data that are associated to grid points of a three-dimensional grid.

A second option for handling a three dimensional grid is illustrated in FIG. 11. FIG. 11 is again a diagram schematically presenting a first grid for ground floor 0, a second grid for a first floor 1 and a third grid for a second floor 2. Together, the three grids for each floor form a three-dimensional grid. To each grid point, either no data or one or more pieces of information are assigned. The pieces of information may include for instance Rx level, pathloss and TA measurement, etc.

All grid points of the three-dimensional grid are scanned in a predetermined order and the associated updated data is RLE encoded, to obtain a single RLE stream. In the presented example, the rows of the ground floor 0 are scanned back and forth, starting with the bottom row, then the rows of the first floor 1 are scanned back and forth, starting with the top row, and finally, the rows of the second floor 2 are scanned back and forth, starting with the bottom row. In this alternative, the resulting RLE stream itself is thus truly 3D. The employed record structure may be the same as one of the record structures described with reference to FIG. 6.

Whereas a decoder decoding an RLE stream representing a two-dimensional grid has to know the row length of the grid so that it can change the row at the correct location, a decoder decoding an RLE stream representing a three-dimensional grid has to know the column length in addition to the row length so that the decoder knows when to move to the next vertical level. Parameters defining row length and column length may be added to the encoded data for each grid.

The grid spacing in the vertical direction can be defined similarly as for latitude and longitude directions. However, in the case a floor-based altitude is used, a vertical grid spacing is not required, because it can implicitly be assumed at the decoder that any change of level is a change to the next floor.

If there is a floor for which no data is available so far, this can be handled by using empty records, which may result in large jumps in the RLE encoding. Alternatively, a particular record type could be defined for indicating the skipping of a floor without data.

In a third option for handling a three dimensional grid, the altitude information is integrated in the data for each grid point of a two-dimensional grid. That is, a single 2D RLE stream is used to store 3D information. In principle, the RLE stream records may have the following structure:

{x, y, data}

Here, x and y represent the grid point location in the two-dimensional plane, for instance longitude and latitude co-ordinates of a grid point of the grid associated to ground floor 0 in FIG. 10. The data associated to this grid point may be data={Rx level in floor 0, Rx level in floor 1, Rx level in floor 2}. Thus, the data carries the vertical dimension information at the given 2D grid point. The relevant floor may be indicated explicitly in each data item. In this case, the Rx level on the one hand and the floor number on the other hand could be considered to be at least two types of the pieces of information. The relevant floor may also be known simply by the position of data items in the record. In this case, the data items on the one hand and the total number of floors, which may be implied by the number of data items in the record, on the other hand could also be considered to be at least two types of pieces of information.

It is to be understood that pieces of information of further types may be included as well in the records. The employed record structure for each grid point may be similar to one of the record structures described with reference to FIG. 6.

In a variation of the third option, the data might be of the form: data={floorMask, {data for floors}}. Here the mask floorMask indicates for which floors there is data. For instance, in case there is data only for floors 0 and 2, the mask could be, for instance, $00000101_2$, when using a one byte mask. The decoder then knows from the number and positions of "1"s in this byte that the record carries data for two floors, namely the $0^{th}$ and the $2^{nd}$ floor. In this case, the mask is a piece of information of a first type, and the data for a respective floor comprises at least one piece of information of at least one further type.

In a further variation, the data in a received message is not floor-based but the vertical dimension is described in terms of quantized continuous altitude. In this case, the vertical grid spacing needs to be known. Then, the quantized altitude information can be handled in a similar manner as floor numbers.

Server 400 may store the RLE encoded data in memory 406 for further use. (action 915)

In addition to measurement results, like WLAN Rx levels collected in a building, and—in the third option—altitude information, the data in the RLE streams may also include any other type of information, for example information on WLAN AP locations and WLAN AP characteristics. This may be particularly useful, when using RLE streams reflecting data with a three-dimensional distribution to carry positioning assistance to terminals within a building.

Whenever needed for creating or updating radio models or for otherwise supporting a positioning of mobile devices, server 400 may retrieve the stored encoded data from memory 406. The data may then be decoded to obtain a three-dimensional model of measurement results or other data and used at server 400 or at some other entity, for instance at a mobile device or at some other server. (action 916)

An RLE encoding of data that are linked to three dimensional locations may be combined with all or selected features of any other presented embodiment, but it could also be implemented independently of any of the other presented embodiments. For example, the presented first and second option for RLE encoding data that are associated to three dimensional locations may be used as well for encoding pieces of information of a single type, for instance Rx level values only. Thus, the 3D-RLE encoding also constitutes an aspect of its own.

Any presented connection in the described embodiments is to be understood in a way that the involved components are operationally coupled. Thus, the connections can be direct or indirect with any number or combination of intervening elements, and there may be merely a functional relationship between the components.

Further, as used in this text, the term 'circuitry' refers to any of the following:

(a) hardware-only circuit implementations (such as implementations in only analog and/or digital circuitry)

(b) combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this text, including in any claims. As a further example, as used in this text, the term 'circuitry' also covers an implementation of merely a processor (or multiple processors) or portion of a processor and its (or their) accompanying software and/or firmware. The term 'circuitry' also covers, for example, a baseband integrated circuit or applications processor integrated circuit for a mobile phone.

Any of the processors mentioned in this text could be a processor of any suitable type. Any processor may comprise but is not limited to one or more microprocessors, one or more processor(s) with accompanying digital signal processor(s), one or more processor(s) without accompanying digital signal processor(s), one or more special-purpose computer chips, one or more field-programmable gate arrays (FPGAS), one or more controllers, one or more application-specific integrated circuits (ASICS), or one or more computer(s). The relevant structure/hardware has been programmed in such a way to carry out the described function.

Any of the memories mentioned in this text could be implemented as a single memory or as a combination of a plurality of distinct memories, and may comprise for example a read-only memory, a random access memory, a flash memory or a hard disc drive memory etc.

Moreover, any of the actions described or illustrated herein may be implemented using executable instructions in a general-purpose or special-purpose processor and stored on a computer-readable storage medium (e.g., disk, memory, or the like) to be executed by such a processor. References to 'computer-readable storage medium' should be understood to encompass specialized circuits such as FPGAs, ASICs, signal processing devices, and other devices.

The functions illustrated by processor 101 or 401 in combination with memory 102 or 402, respectively, or the integrated circuit 405 can also be viewed as means for run-length encoding data, which are associate to grid points of a grid, to obtain a sequence of records, the records being defined such that they allow embedding data associated to a same grid point and representing pieces of information of at least two different types in a same record; and as means for causing at least one of storage and transmission of the encoded data. The functions illustrated by processor 201, 401 or 501 in combination with memory 202, 402 or 502, respectively, or the integrated circuit 405 or 505 can also be viewed as means for receiving or retrieving run-length encoded data in a sequence of records, wherein the data are associate to grid points of a grid and wherein data, which are associated to a same grid point of the grid and which represent pieces of information of at least two different types, are embedded in a same record of the sequence of records; and as means for run-length decoding the data to obtain decoded data and an association of the decoded data to the grid points of the grid.

The program codes in memory 102, 202, 402 or memory 502, respectively, can also be viewed as comprising such means in the form of functional modules.

FIGS. 2, 4 and 6 may also be understood to represent exemplary functional blocks of computer program codes for encoding or decoding data representing pieces of information of different types.

It will be understood that all presented embodiments are only exemplary, and that any feature presented for a particular exemplary embodiment may be used with any aspect of the invention on its own or in combination with any feature presented for the same or another particular exemplary embodiment and/or in combination with any other feature not mentioned. It will further be understood that any feature presented for an exemplary embodiment in a particular category may also be used in a corresponding manner in an exemplary embodiment of any other category.

What is claimed is:

1. A method comprising at an apparatus:
    run-length encoding data, which are associate to grid points of a grid, to obtain a sequence of records, the records being defined such that they allow embedding data associated to a same grid point and representing pieces of information of at least two different types in a same record; and
    causing at least one of storage and transmission of the encoded data.

2. The method according to claim 1, wherein each grid point corresponds to a location, wherein the data represents at least pieces of information corresponding to results of at least two different types of measurements, and wherein the encoded data is provided for supporting a terrestrial radio signal based positioning.

3. The method according to claim 1, wherein the records are defined such that they allow including in a record at least one indication of at least one type of content of the record.

4. The method according to claim 3, wherein the at least one type of content comprises at least one of:
    at least one type of content for a number of subsequent grid points to which no data is associated;
    at least one type of content for data representing pieces of information of a single type; and
    at least one type of content for data representing pieces of information of a plurality of types.

5. The method according to claim 1, wherein the sequence of records comprises for each grid point, to which data is associated, and for each grid point, which is a first grid point in a sequence of grid points in a predetermined order of grid points to which no data is associated, a record with:
    an indication of a type of content of the record, the type specifying the size of the content; and
    content of the specified size, the content including one of data associated to the grid point, and an indication of the number of subsequent grid points, starting with the grid point, to which no data is associated.

6. The method according to claim 1, wherein the sequence of records comprises for each grid point, to which data is associated, and for each grid point, which is a first grid point in a sequence of grid points in a predetermined order of grid points to which no data is associated, a record with:
    a header with a first field and a second field, the first field indicating whether data is associated to the grid point, wherein whenever the first field indicates that no data is associated to the grid point the second field indicating the number of subsequent grid points to which no data is associated, and whenever the first field indicates that data is associated to the grid point, the second field indicating a type of content, the type of content specifying the size of the content; and
    content, whenever the first field in the header indicates that data is associated to the grid point, the content including data associated to the grid point.

7. The method according to claim 1, wherein the sequence of records comprises for each grid point, to which data is associated, and for each grid point, which is a first grid point in a sequence of grid points in a predetermined order of grid points to which data is associated, a record with a header indicating explicitly or implicitly a total size of content and with content of the indicated total size, the content comprising:
    at least one indication of a type of at least one entity with partial content, the type specifying a size of the entity with the partial content; and
    at least one entity with partial content of the specified size, the partial content including one of data representing pieces of information of a single type associated to the grid point, and an indication of the number of subsequent grid points, starting with the grid point, to which no data is associated.

8. A method comprising at an apparatus:
    receiving or retrieving run-length encoded data in a sequence of records, wherein the data are associate to grid points of a grid and wherein data, which are associated to a same grid point of the grid and which represent pieces of information of at least two different types, are embedded in a same record of the sequence of records; and
    run-length decoding the data to obtain decoded data and an association of the decoded data to the grid points of the grid.

9. The method according to claim 1, wherein the grid is a three-dimensional grid and wherein each grid point corresponds to a location in a three-dimensional space, the run-length encoding comprising run-length encoding the data using a predetermined order of grid points of the three-dimensional grid.

10. An apparatus comprising at least one processor and at least one memory including computer program code, the at least one memory and the computer program code configured to, with the at least one processor, cause an apparatus at least to perform:
    run-length encode data, which are associate to grid points of a grid, to obtain a sequence of records, the records being defined such that they allow embedding data associated to a same grid point and representing pieces of information of at least two different types in a same record; and cause at least one of storage and transmission of the encoded data.

11. The apparatus according to claim 10, wherein each grid point corresponds to a location, wherein the data represents at least pieces of information corresponding to results of at least two different types of measurements, and wherein the encoded data is provided for supporting a terrestrial radio signal based positioning.

12. The apparatus according to claim 10, wherein the records are defined such that they allow including in a record at least one indication of at least one type of content of the record.

13. The apparatus according to claim 12, wherein the at least one type of content comprises at least one of:
   at least one type of content for a number of subsequent grid points to which no data is associated;
   at least one type of content for data representing pieces of information of a single type; and
   at least one type of content for data representing pieces of information of a plurality of types.

14. The apparatus according to claim 10, wherein the sequence of records comprises for each grid point, to which data is associated, and for each grid point, which is a first grid point in a sequence of grid points in a predetermined order of grid points to which no data is associated, a record with:
   an indication of a type of content of the record, the type specifying the size of the content; and
   content of the specified size, the content including one of data associated to the grid point, and an indication of the number of subsequent grid points, starting with the grid point, to which no data is associated.

15. The apparatus according to claim 10, wherein the sequence of records comprises for each grid point, to which data is associated, and for each grid point, which is a first grid point in a sequence of grid points in a predetermined order of grid points to which no data is associated, a record with:
   a header with a first field and a second field, the first field indicating whether data is associated to the grid point, wherein whenever the first field indicates that no data is associated to the grid point the second field indicating the number of subsequent grid points to which no data is associated, and whenever the first field indicates that data is associated to the grid point, the second field indicating a type of content, the type of content specifying the size of the content; and
   content, whenever the first field in the header indicates that data is associated to the grid point, the content including data associated to the grid point.

16. The apparatus according to claim 10, wherein the sequence of records comprises for each grid point, to which data is associated, and for each grid point, which is a first grid point in a sequence of grid points in a predetermined order of grid points to which data is associated, a record with a header explicitly or implicitly indicating a total size of content and with content of the indicated total size, the content comprising:
   at least one indication of a type of at least one entity with partial content, the type specifying a size of the entity of the partial content; and
   at least one entity with partial content of the specified size, the partial content including one of data representing pieces of information of a single type associated to the grid point, and an indication of the number of subsequent grid points, starting with the grid point, to which no data is associated.

17. The apparatus according to claim 10, wherein the grid is a two-dimensional grid and wherein each grid point corresponds to a location in a two-dimensional space, the at least one memory and the computer program code further configured to, with the at least one processor, cause an apparatus to add to the encoded data an indication of a value of a third dimension to which the data are associated.

18. The apparatus according to claim 10, wherein the grid is a three-dimensional grid and wherein each grid point corresponds to a location in a three-dimensional space, the run-length encoding comprising run-length encoding the data using a predetermined order of grid points of the three-dimensional grid.

19. The apparatus according to claim 10, wherein each grid point corresponds to a location in a two-dimensional space and wherein the pieces of information of at least two different types comprise information on at least one type of measurement and information on a value of a third dimension to which the information on the at least one type of measurement is associated.

20. An apparatus comprising at least one processor and at least one memory including computer program code, the at least one memory and the computer program code configured to, with the at least one processor, cause the apparatus at least to perform:
   receive or retrieve run-length encoded data in a sequence of records, wherein the data are associate to grid points of a grid and wherein data, which are associated to a same grid point of the grid and which represent pieces of information of at least two different types, are embedded in a same record of the sequence of records; and
   run-length decode the data to obtain decoded data and an association of the decoded data to the grid points of the grid.

* * * * *